United States Patent
Zhao

(10) Patent No.: US 9,947,713 B2
(45) Date of Patent: Apr. 17, 2018

(54) DETECTION SUBSTRATE AND MANUFACTURING METHOD THEREOF, AND DETECTOR

(71) Applicant: BOE TECHNOLOGY GROUP CO., LTD., Beijing (CN)

(72) Inventor: Lei Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/894,865

(22) PCT Filed: May 15, 2015

(86) PCT No.: PCT/CN2015/079012
§ 371 (c)(1),
(2) Date: Nov. 30, 2015

(87) PCT Pub. No.: WO2016/112608
PCT Pub. Date: Jul. 21, 2016

(65) Prior Publication Data
US 2016/0365381 A1 Dec. 15, 2016

(30) Foreign Application Priority Data
Jan. 12, 2015 (CN) .......................... 2015 1 0014946

(51) Int. Cl.
*H01L 31/062* (2012.01)
*H01L 31/113* (2006.01)
(Continued)

(52) U.S. Cl.
CPC ...... *H01L 27/14663* (2013.01); *G01T 1/2018* (2013.01); *H01L 27/14692* (2013.01);
(Continued)

(58) Field of Classification Search
CPC .................................................. H01L 27/14663
(Continued)

(56) References Cited

U.S. PATENT DOCUMENTS 8,729,478 B2 * 5/2014 Tredwell ............... G01T 1/2018
250/362
2002/0027229 A1 * 3/2002 Yamazaki ................. G01J 1/44
257/84
(Continued)

FOREIGN PATENT DOCUMENTS

CN 102576715 7/2012
CN 103855172 6/2014
(Continued)

*Primary Examiner* — Igwe U Anya
(74) *Attorney, Agent, or Firm* — Harness, Dickey & Pierce, P.L.C.

(57) ABSTRACT

A detection substrate and a manufacturing method thereof, and a detector are provided. The detection substrate comprises a base substrate, a thin film transistor, a PIN photodiode and a scintillation layer. The thin film transistor and the PIN photodiode are provided above a first face of the base substrate and the scintillation layer is provided above a second face of the base substrate. The visible light obtained after the X-ray passes through the scintillation layer is directly irradiated on the PIN photodiode after passing through the base substrate with relative high transmittance, thus preventing intensity of the light irradiated on the PIN photodiode from being weakened, and improving light utilization efficiency of the detection substrate.

13 Claims, 2 Drawing Sheets

(51) Int. Cl.
  *H01L 21/00* (2006.01)
  *H01L 27/146* (2006.01)
  *H01L 31/105* (2006.01)
  *G01T 1/20* (2006.01)
  *H01L 31/0224* (2006.01)
  *H01L 31/18* (2006.01)

(52) U.S. Cl.
  CPC ............... *H01L 27/14696* (2013.01); *H01L 31/022408* (2013.01); *H01L 31/105* (2013.01); *H01L 31/1884* (2013.01); *H01L 27/14612* (2013.01)

(58) Field of Classification Search
  USPC ................................. 257/292, 53; 438/96
  See application file for complete search history.

(56) References Cited

U.S. PATENT DOCUMENTS

| | | | | |
|---|---|---|---|---|
| 2008/0245968 | A1* | 10/2008 | Tredwell | G01T 1/2018 250/370.09 |
| 2010/0054418 | A1* | 3/2010 | Okada | G01T 1/2018 378/114 |
| 2012/0061578 | A1* | 3/2012 | Lim | G01T 1/2928 250/370.14 |
| 2012/0299070 | A1* | 11/2012 | Yamada | H01L 31/02164 257/291 |
| 2014/0027828 | A1 | 1/2014 | Kim | |
| 2014/0231804 | A1* | 8/2014 | Yan | H01L 27/1214 257/53 |
| 2014/0284605 | A1* | 9/2014 | Tang | H01L 31/1055 257/53 |
| 2015/0340511 | A1* | 11/2015 | Yan | H01L 29/66969 257/43 |

FOREIGN PATENT DOCUMENTS

| | | |
|---|---|---|
| CN | 104022132 | 9/2014 |
| CN | 104241436 | 12/2014 |
| JP | 2005-114456 | 4/2005 |
| JP | 2006/189296 | 7/2006 |

\* cited by examiner

DETECTION SUBSTRATE AND MANUFACTURING METHOD THEREOF, AND DETECTOR

TECHNICAL FIELD

The present invention relates to field of detection technology, and in particularly, to a detection substrate and a manufacturing method thereof, and a detector.

TECHNICAL BACKGROUND

FIG. 1 is a structural diagram of a detection substrate in the prior art. As shown in FIG. 1, the detection substrate comprises a base substrate 101 onto which a thin film transistor is provided, and the thin film transistor comprises a gate 104, a gate insulation layer 105, an active layer 106, a source 107 and a drain 108. A PIN photodiode 102 is provided above the source 107 and the drain 108. A passivation layer 109 is provided above the source 107, the drain 108 and the PIN photodiode 102. A metal layer 201 is provided above the active layer 106. The metal layer 201 is arranged to shield light irradiated towards the active layer 106. A resin encapsulation layer 202 is provided above the passivation layer 109 and the metal layer 201. A scintillation layer 103 is provided above the resin encapsulation layer 202.

Absorption efficiency of the detection substrate to visible light is decided by the PIN photodiode 102, therefore, the PIN photodiode 102 can influence a plurality of critical indexes of the detection substrate, e.g. dose of X-ray, resolution of X-ray imaging, response speed of an image. However, in an existing detection substrate, the scintillation layer 103 is provided above the thin film transistor and the PIN photodiode 102, the visible light obtained after the X-ray passes through the scintillation layer 103 is irradiated on the PIN photodiode 102 after passing through the resin encapsulation layer 202 with low transmittance, thus making intensity of the light irradiated on the PIN photodiode 102 being weakened, and reducing light utilization efficiency of the detection substrate.

SUMMARY OF THE INVENTION

Embodiments of the present invention provide a detection substrate and a manufacturing method thereof, and a detector, which can address the problem of low light utilization efficiency of detection substrate caused by providing the scintillation layer above the thin film transistor and the PIN photodiode in the existing detection substrate.

To this end, an embodiment of the present invention provides a detection substrate which comprises a base substrate, a thin film transistor, a PIN photodiode and a scintillation layer. The thin film transistor comprises a gate, an active layer, a source and a drain. The thin film transistor and the PIN photodiode are provided above a first face of the base substrate, and the scintillation layer is provided above a second face of the base substrate.

In an embodiment of the present invention, the drain is provided at a side of the PIN photodiode away from the base substrate, and the drain is electrically connected with the PIN photodiode.

In an embodiment of the present invention, the active layer is provided at a side of the gate away from the base substrate so that the gate shields light irradiated towards the active layer.

In an embodiment of the present invention, the detection substrate further comprises cathode metal and a transparent electrode, the transparent electrode is provided at a side of the cathode metal away from the base substrate.

In an embodiment of the present invention, the cathode metal is provided at a same layer as the gate, and the cathode metal is made of the same material as that of the gate.

In an embodiment of the present invention, the PIN photodiode comprises a P-type layer, an I-type layer and an N-type layer, the P-type layer is provided at a side of the cathode metal away from the base substrate, the I-type layer is provided at a side of the P-type layer away from the base substrate, the N-type layer is provided at a side of the I-type layer away from the base substrate, and the N-type layer is electrically connected with the drain.

In an embodiment of the present invention, the PIN photodiode comprises a P-type layer, an I-type layer and an N-type layer, the N-type layer is provided at a side of the cathode metal away from the base substrate, the I-type layer is provided at a side of the N-type layer away from the base substrate, the P-type layer is provided at a side of the I-type layer away from the base substrate, and the P-type layer is electrically connected with the drain.

In an embodiment of the present invention, the scintillation layer is made of $Gd_2O_2S$, CsI or HgI.

Another embodiment of the present invention further provides a detector comprising any one of the above detection substrates.

Another embodiment of the present invention further provides a manufacturing method for a detection substrate. The method comprises: forming a thin film transistor and a PIN photodiode above a first face of a base substrate, wherein the thin film transistor comprises a gate, an active layer, a source and a drain; and forming a scintillation layer above a second face of the base substrate.

In an embodiment of the present invention, the step of forming a thin film transistor and a PIN photodiode above a first face of a base substrate comprises: forming cathode metal and the gate above the first face of the base substrate, the cathode metal is provided at a same layer as the gate, and the cathode metal is made of the same material as that of the gate; forming the PIN photodiode above the cathode metal; forming the active layer above the gate so that the gate shields light irradiated towards the active layer; and forming the source and the drain above the active layer and the PIN photodiode, the drain is electrically connected with the PIN photodiode.

In an embodiment of the present invention, the step of forming the PIN photodiode above the cathode metal comprises: forming a P-type layer above the cathode metal; forming an I-type layer above the P-type layer; and forming an N-type layer above the I-type layer, the N-type layer is electrically connected with the drain.

In an embodiment of the present invention, the step of forming the PIN photodiode above the cathode metal comprises: forming an N-type layer above the cathode metal; forming an I-type layer above the N-type layer; and forming a P-type layer above the I-type layer, the P-type layer is electrically connected with the drain.

The embodiments of the present invention have following advantages: in the detection substrate and manufacturing method thereof, and the detector provided by the present invention, the detection substrate comprises a base substrate, a thin film transistor, a PIN photodiode and a scintillation layer, the thin film transistor and the PIN photodiode are provided above a first face of the base substrate and the scintillation layer is provided above a second face of the base substrate, the visible light obtained after the X-ray passes through the scintillation layer is directly irradiated on the PIN photodiode after passing through the base substrate with relative high transmittance (rather than passing through the resin encapsulation layer with relative low transmittance), thus preventing intensity of the light irradiated on the PIN photodiode from being weakened, and improving light utilization efficiency of the detection substrate.

DETAILED DESCRIPTION OF THE INVENTION

To enable a person skilled in the art to better understand the technical solution of the present invention, the detection substrate and the manufacturing method thereof, and the detector provided by the present invention will be described in detail below with reference to attached drawings.

First Embodiment

Figure 1:
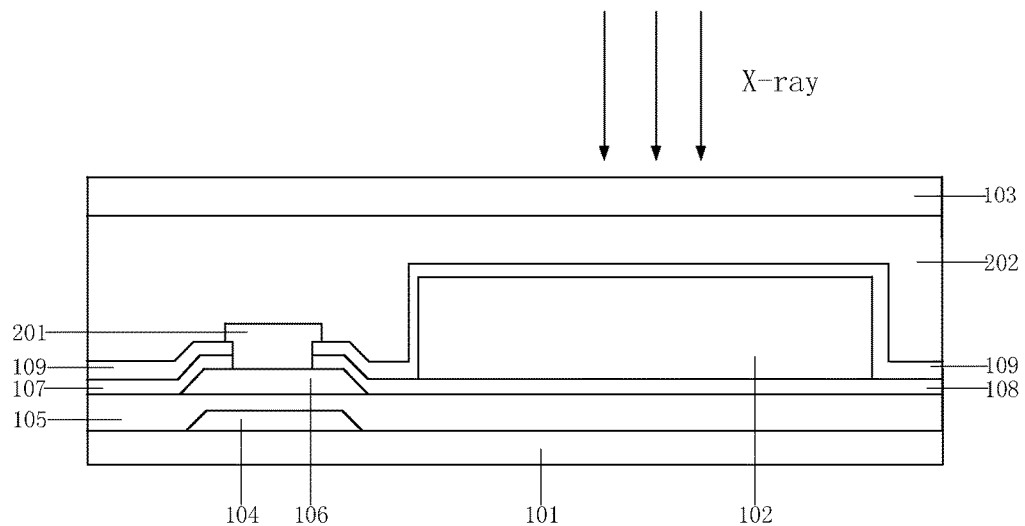
FIG. 1 is a structural diagram of a detection substrate in the prior art.
Figure 2:
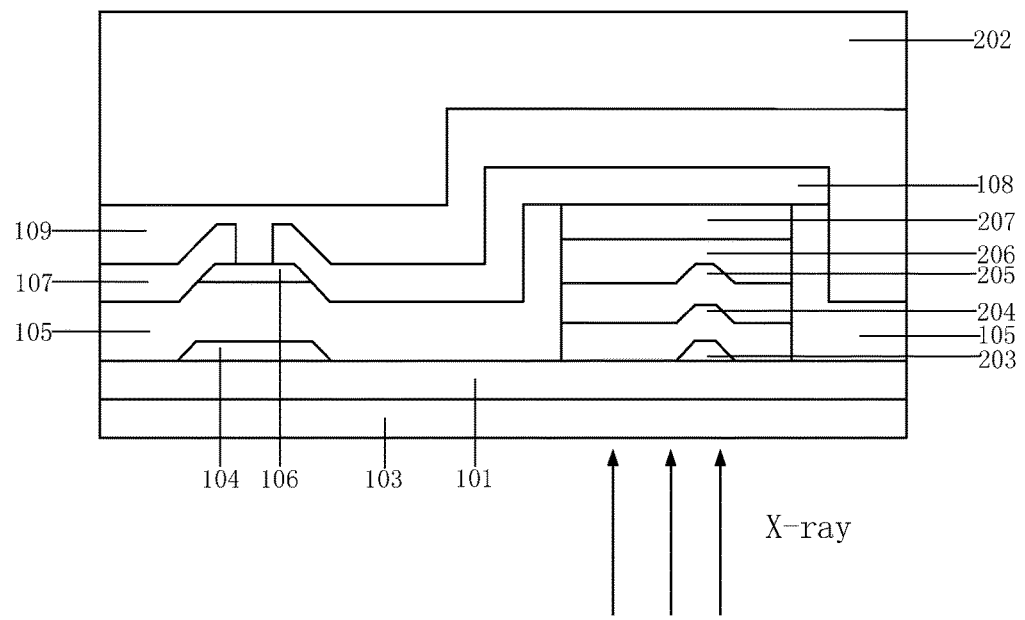
FIG. 2 is a structural diagram of a detection substrate according to a first embodiment of the present invention.

FIG. 2 is a structural diagram of a detection substrate provided by a first embodiment of the present invention. As shown in FIG. 2, the detection substrate comprises a base substrate 101, a thin film transistor, a PIN photodiode and a scintillation layer 103, the thin film transistor comprises a gate 104, an active layer 106, a source 107 and a drain 108, the thin film transistor and the PIN photodiode are provided above a first face of the base substrate 101, and the scintillation layer 103 is provided above a second face of the base substrate 101. It is to be noted that in the present embodiment, the drain 108 of the thin film transistor is equivalent to an anode of the PIN photodiode.

In practice, the scintillation layer 103 may be formed from scintillator material (e.g. $Gd_2O_2S$, CsI or HgI). The scintillation layer 103 is arranged to convert high energy particles or rays into visible light after absorbing the high energy particles or rays. Detailed working principle of the scintillation layer 103 is as follows: when orbital electrons of atoms in the scintillator material have received energy that is larger than band gap from incident particles, the orbital electrons are excited to transition to conduction band. Then, the orbital electrons return to ground state through a series of physical processes, and emit fluorescent light with very short decay time or phosphorescence light with relative long decay time depending on deexcitation mechanism. Wavelength of the fluorescent light is about 10 ns, and that of the phosphorescent light is about 1 μs. Of course, wavelength of the phosphorescent light may be even longer, and wavelength of light produced by different scintillator materials upon being excited will also be different.

In the present embodiment, X-ray enters into the detection substrate from the second face side of the base substrate 101, and the scintillation layer 103 may, after being exposed by the X-ray, convert the X-ray into visible light, the PIN photodiode converts the visible light into an electrical signal, the thin film transistor reads the electrical signal and converts the electrical signal into a digital signal, then the detection substrate transfers the digital signal to a computer image processing system, and finally an X-ray image is formed. In this embodiment, the thin film transistor and the PIN photodiode are both provided above the first face of the base substrate 101, and the scintillation layer 103 is provided above the second face of the base substrate 101. Since the scintillation layer 103 and the PIN photodiode are located at opposite sides of the base substrate 101, the visible light obtained after the X-ray passes through the scintillation layer is directly irradiated on the PIN photodiode after passing through the base substrate which has relative high transmittance, thus preventing intensity of the light irradiated on the PIN photodiode from being weakened, and improving light utilization efficiency of the detection substrate.

In the embodiment, the detection substrate may further comprise cathode metal 203 and a transparent electrode 204, the transparent electrode 204 is provided above the cathode metal 203. It is to be noted that in the present embodiment, the cathode metal 203 and the transparent electrode 204 are equivalent to a cathode of the PIN photodiode. The cathode metal 203 and the gate 104 are both provided on the base substrate 101, and the cathode metal 203 is provided at a same layer as the gate 104, furthermore, the cathode metal 203 is made of the same material as that of the gate 104, therefore, the cathode metal 203 and the gate 104 can be formed by one patterning process, and thus it is possible to effectively reduce process routines, improve production efficiency, and reduce production cost.

In the present embodiment, a gate insulation layer 105 is provided above the gate 104 and the PIN photodiode. A via hole is provided at a portion of the gate insulation layer 105 that is located above the PIN photodiode. The active layer 106 is provided above the gate insulation layer 105. Since the active layer 106 is provided above the gate 104 (that is, the gate 104 is provided at a light incident side with respect to the active layer 106, or in other words, the active layer 106 is provided at a side of the gate 104 away from the base substrate 101), the gate 104 is capable of shielding light irradiated towards the active layer 106. The gate 104 may act to protect the active layer 106, and when the detection substrate is being irradiated by X-ray, no light will be irradiated on the active layer 106, thus preventing performance of the active layer 106 from being influenced by the light.

In the present embodiment, the source 107 and the drain 108 are provided above the active layer 106, the gate insulation layer 105 and the PIN photodiode. The drain 108 is connected with the PIN photodiode through the via hole in the gate insulation layer 105. A passivation layer 109 is provided above the source 107 and the drain 108, and a resin encapsulation layer 202 is provided above the passivation layer 109.

In practice, the PIN photodiode may comprise a P-type layer, an I-type layer and an N-type layer. A transparent electrode 204 is provided above the cathode metal 203, the P-type layer 205 is provided above the transparent electrode 204, the I-type layer 206 is provided above the P-type layer 205, and the N-type layer 207 is provided above the I-type layer 206. The N-type layer 207 is connected with the drain 108.

In the detection substrate provided by the present embodiment, the detection substrate comprises a base substrate, a thin film transistor, a PIN photodiode and a scintillation layer, the thin film transistor and the PIN photodiode are provided above a first face of the base substrate, and the scintillation layer is provided above a second face of the base substrate. Visible light obtained after X-ray passes through the scintillation layer is directly irradiated on the PIN photodiode after passing through the base substrate with relative high transmittance, thus preventing intensity of the light irradiated on the PIN photodiode from being weakened, and improving light utilization efficiency of the detection substrate.

Second Embodiment

Figure 3:
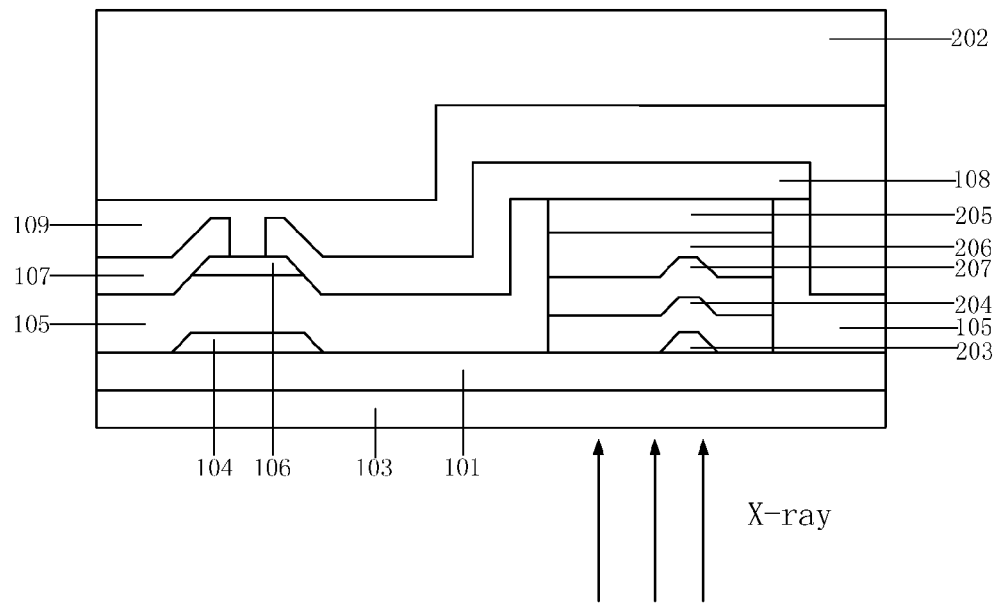
FIG. 3 is a structural diagram of another detection substrate according to a second embodiment of the present invention.

FIG. 3 is a structural diagram of another detection substrate provided by a second embodiment of the present invention. As shown in FIG. 3, the detection substrate comprises a base substrate 101, a thin film transistor, a PIN photodiode and a scintillation layer 103, the thin film transistor comprises a gate 104, an active layer 106, a source 107 and a drain 108, the thin film transistor and the PIN photodiode are provided above a first face of the base substrate 101, and the scintillation layer 103 is provided above a second face of the base substrate 101. It is to be noted that in the present embodiment, the drain 108 of the thin film transistor is equivalent to an anode of the PIN photodiode.

In practice, the scintillation layer 103 may be formed from scintillator material (e.g. $Gd_2O_2S$, CsI or HgI). The scintillation layer 103 is arranged to convert high energy particles or rays into visible light after absorbing the high energy particles or rays. Detailed working principle of the scintillation layer 103 is as follows: when orbital electrons of atoms in the scintillator material have received energy that is larger than band gap from incident particles, the orbital electrons are excited to transition to conduction band. Then, the orbital electrons return to ground state through a series of physical processes, and emit fluorescent light with very short decay time or phosphorescence light with relative long decay time depending on deexcitation mechanism. Wavelength of the fluorescent light is about 10 ns, and that of the phosphorescent light is about 1 µs. Of course, wavelength of the phosphorescent light may be even longer, and wavelength of light produced by different scintillator materials upon being excited will also be different.

In the present embodiment, X-ray enters into the detection substrate from the second face of the base substrate 101, and the scintillation layer 103 may, after being exposed by the X-ray, convert the X-ray into visible light, the PIN photodiode converts the visible light into an electrical signal, the thin film transistor reads the electrical signal and converts the electrical signal into a digital signal, then the detection substrate transfers the digital signal to a computer image processing system, and finally an X-ray image is formed. In this embodiment, the thin film transistor and the PIN photodiode are both provided above the first face of the base substrate 101, and the scintillation layer 103 is provided above the second face of the base substrate 101. Since the scintillation layer 103 and the PIN photodiode are located at opposite sides of the base substrate 101, the visible light obtained after the X-ray passes through the scintillation layer is directly irradiated on the PIN photodiode after passing through the base substrate which has relative high transmittance, thus preventing intensity of the light irradiated on the PIN photodiode from being weakened, and improving light utilization efficiency of the detection substrate.

In the embodiment, the detection substrate may further comprise cathode metal 203 and a transparent electrode 204, the transparent electrode 204 is provided above the cathode metal 203. It is to be noted that in the present embodiment, the cathode metal 203 and the transparent electrode 204 are equivalent to a cathode of the PIN photodiode. The cathode metal 203 and the gate 104 are both provided on the base substrate 101, and the cathode metal 203 is provided at a same layer as the gate 104, furthermore, the cathode metal 203 is made of the same material as that of the gate 104, therefore, the cathode metal 203 and the gate 104 can be formed by one patterning process, and thus it is possible to effectively reduce process routines, improve production efficiency, and reduce production cost.

In the present embodiment, a gate insulation layer 105 is provided above the gate 104 and the PIN photodiode. A via hole is provided at a portion of the gate insulation layer 105 that is located above the PIN photodiode. The active layer 106 is provided above the gate insulation layer 105. Since the active layer 106 is provided above the gate 104 (that is, the gate 104 is provided at a light incident side with respect to the active layer 106, or in other words, the active layer 106 is provided at a side of the gate 104 away from the base substrate 101), the gate 104 is capable of shielding light irradiated towards the active layer 106. The gate 104 may act to protect the active layer 106, and when the detection substrate is being irradiated by X-ray, no light will be irradiated on the active layer 106, thus preventing performance of the active layer 106 from being influenced by the light.

In the present embodiment, the source 107 and the drain 108 are provided above the active layer 106, the gate insulation layer 105 and the PIN photodiode. The drain 108 is connected with the PIN photodiode through the via hole in the gate insulation layer 105. A passivation layer 109 is provided above the source 107 and the drain 108, and a resin encapsulation layer 202 is provided above the passivation layer 109.

In practice, the PIN photodiode may comprise a P-type layer, an I-type layer and an N-type layer. A transparent electrode 204 is provided above the cathode metal 203, the N-type layer 207 is provided above the transparent electrode 204, the I-type layer 206 is provided above the N-type layer 207, and the P-type layer 205 is provided above the I-type layer 206. The P-type layer 205 is connected with the drain 108.

In the detection substrate provided by the present embodiment, the detection substrate comprises a base substrate, a thin film transistor, a PIN photodiode and a scintillation layer, the thin film transistor and the PIN photodiode are provided above a first face of the base substrate, and the scintillation layer is provided above a second face of the base substrate. Visible light obtained after X-ray passes through the scintillation layer is directly irradiated on the PIN photodiode after passing through the base substrate with relative high transmittance, thus preventing intensity of the light irradiated on the PIN photodiode from being weakened, and improving light utilization efficiency of the detection substrate.

Third Embodiment

The present embodiment provides a detector comprising the detection substrate provided in the above first embodiment or the second embodiment. For details about the detection substrate, reference may be made to the description in the above first embodiment or the second embodiment, which will be omitted here for brevity.

In the detector provided by the present embodiment, the detection substrate comprises a base substrate, a thin film transistor, a PIN photodiode and a scintillation layer, the thin film transistor and the PIN photodiode are provided above a first face of the base substrate, and the scintillation layer is provided above a second face of the base substrate. Visible light obtained after X-ray passes through the scintillation layer is directly irradiated on the PIN photodiode after passing through the base substrate with relative high transmittance, thus preventing intensity of the light irradiated on the PIN photodiode from being weakened, and improving light utilization efficiency of the detection substrate.

Fourth Embodiment

Figure 4:
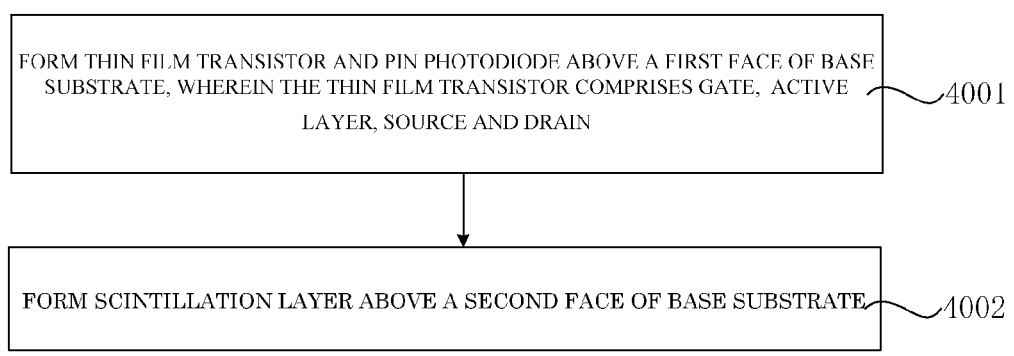
FIG. 4 is a flowchart of a manufacturing method for a detection substrate according to a fourth embodiment of the present invention.

FIG. 4 is a flowchart of a manufacturing method for a detection substrate provided by a fourth embodiment of the present invention. As shown in FIG. 4, the manufacturing method comprises:

Step 4001: forming a thin film transistor and a PIN photodiode above a first face of a base substrate, wherein the thin film transistor comprises a gate, an active layer, a source and a drain; and Step 4002: forming a scintillation layer above a second face of the base substrate.

Referring to FIG. 2 and FIG. 3, the detection substrate comprises the base substrate 101, the thin film transistor, the PIN photodiode and the scintillation layer 103, the thin film transistor comprises the gate 104, the active layer 106, the source 107 and the drain 108. The thin film transistor and the PIN photodiode are provided above the first face of the base substrate 101, and the scintillation layer 103 is provided above the second face of the base substrate 101. It is to be noted that in the present embodiment, the drain 108 of the thin film transistor is equivalent to an anode of the PIN photodiode.

In the present embodiment, a gate metal film is formed above the first face of the base substrate 101, the gate metal film may be made of metal such as Mo, Al, Ti, Cu, Nd or Nb, etc. Photo resist is coated on the gate metal film, and is exposed and developed by using a mask plate to form a photo resist remaining area and a photo resist removing area. The photo resist remaining area corresponds to a pattern area for forming the gate 104 and the cathode metal 203. The photo resist removing area corresponds to an area other than the pattern area. The gate metal film is etched to form the gate 104 and the cathode metal 203. Since the cathode metal 203 and the gate 104 are formed by one patterning process, it is possible to effectively reduce process routines, thus improving production efficiency and reducing production cost.

In the present embodiment, a gate insulation layer 105 is formed above the gate 104 and the PIN photodiode, the gate insulation layer 105 may be made of SixOy, SixNy, SixOyNz, AlxOy or TixOy. A via hole is formed in an area of the gate insulation layer 105 corresponding to the PIN photodiode by photolithography process. An active layer film is formed on the gate insulation layer 105. The active layer film may be made of α-Si:H, LTPS, IGZO, ITZO or ZnON. The active layer film is coated with a photo resist, and the photo resist is exposed, developed by using a mask plate to form a photo resist remaining area and a photo resist removing area. The photo resist remaining area corresponds to a pattern area for forming the active layer. The photo resist removing area corresponds to an area other than the pattern area. The active layer film is etched to form the active layer 106. Since the active layer 106 is provided above the gate 104 (that is, the gate 104 is provided at a light incident side with respect to the active layer 106, or in other words, the active layer 106 is provided at a side of the gate 104 away from the base substrate 101), the gate 104 is capable of shielding light irradiated towards the active layer 106. The gate 104 may act to protect the active layer 106, and when the detection substrate is being irradiated by X-ray, no light will be irradiated on the active layer 106, thus preventing performance of the active layer 106 from being influenced by the light.

In the present embodiment, a source/drain metal film is formed above the active layer 106, the gate insulation layer 105 and the PIN photodiode, material of the source/drain metal film is metal such as Mo, Al, Ti, Cu, Nd or Nb etc. Photo resist is coated on the source/drain metal film, and is exposed and developed by using a mask plate to form a photo resist remaining area and a photo resist removing area. The photo resist remaining area corresponds to a pattern area for forming the source and the drain. The photo resist removing area corresponds to an area other than the pattern area. The source/drain metal film is etched to form the source 107 and the drain 108. The drain 108 is connected with the PIN photodiode through the via hole in the gate insulation layer 105. A passivation layer 109 is formed above the source 107 and the drain 108, the passivation layer 109 may be made of SixOy, SixNy, SixOyNz, AlxOy or TixOy. A resin encapsulation layer 202 is formed above the passivation layer 109.

In the present embodiment, the PIN photodiode may comprise a P-type layer, an I-type layer and an N-type layer. A transparent electrode 204 is formed above the cathode metal 203, it is to be noted that in the present embodiment, the cathode metal 203 and the transparent electrode 204 are equivalent to a cathode of the PIN photodiode. In one structure, as shown in FIG. 2, the P-type layer 205 is formed above the transparent electrode 204, the I-type layer 206 is formed above the P-type layer 205, the N-type layer 207 is formed above the I-type layer 206, and the N-type layer 207 is connected with the drain 108. Alternatively, the PIN photodiode has another structure, wherein, as shown in FIG. 3, the PIN photodiode comprises a P-type layer, an I-type layer and an N-type layer, a transparent electrode 204 is formed above the cathode metal 203, the N-type layer 207 is formed above the transparent electrode 204, the I-type layer 206 is formed above the N-type layer 207, the P-type layer 205 is formed above the I-type layer 206, and the P-type layer 205 is connected with the drain 108. The transparent electrode 204 may be made of ITO, IZO or ZNO. The P-type layer 205 may be made of P-type amorphous silicon, and thickness of the P-type layer 205 is in the range of 200 to 700 Å. The I-type layer 206 may be made of intrinsic amorphous silicon, and thickness of the I-type layer 206 is in the range of 5000 to 15000 Å. The N-type layer 207 may be made of N-type amorphous silicon, and thickness of the N-type layer 207 is in the range of 200 to 700 Å.

In the present embodiment, the scintillation layer 103 is formed above the second face of the base substrate 101. The scintillation layer 103 may be made of $Gd_2O_2S$, CsI or HgI. Finally, after packaging, the detection substrate is completed.

In the manufacturing method for a detection substrate as provided by the present embodiment, the detection substrate comprises a base substrate, a thin film transistor, a PIN photodiode and a scintillation layer, the thin film transistor and the PIN photodiode are provided above a first face of the base substrate and the scintillation layer is provided above a second face of the base substrate. Visible light obtained after X-ray passes through the scintillation layer is directly irradiated on the PIN photodiode after passing through the base substrate with relative high transmittance, thus preventing intensity of the light irradiated on the PIN photodiode from being weakened, and improving light utilization efficiency of the detection substrate.

It is appreciated that, the above embodiments are only illustrative embodiments used to illustrate principle of the present invention, and the present invention is not limited thereto. Various variations and modifications may be made by a person skilled in the art without departing from the spirit and substance of the present invention, and such variations and modifications are also considered as protection scope of the present invention.

What is claimed is:

1. A detection substrate comprising:
   a base substrate;
   a thin film transistor;
   a PIN photodiode;
   a scintillation layer;
   a cathode metal; and
   a transparent electrode, wherein:
   the thin film transistor comprises a gate, an active layer, a source and a drain;
   the thin film transistor and the PIN photodiode are positioned above a first face of the base substrate;
   the scintillation layer is positioned above a second face of the base substrate;
   the second face of the base substrate is opposite the first face of the base substrate;
   the cathode metal is positioned at a same layer as the gate, and the cathode metal is made of the same material as that of the gate;
   the transparent electrode is positioned above the cathode metal;
   the PIN photodiode is positioned above the transparent electrode;
   the cathode metal and the transparent electrode are positioned as a cathode of the PIN photodiode; and
   the drain of the thin film transistor is positioned above the PIN photodiode as an anode of the PIN photodiode.

2. The detection substrate according to claim 1, wherein the active layer is positioned at a side of the gate away from the base substrate so that the gate shields light irradiated towards the active layer.

3. The detection substrate according to claim 1, wherein the PIN photodiode comprises a P-type layer, an I-type layer and an N-type layer, the P-type layer is positioned at a side of the cathode metal away from the base substrate, the I-type layer is positioned at a side of the P-type layer away from the base substrate, the N-type layer is positioned at a side of the I-type layer away from the base substrate, and the N-type layer is electrically connected with the drain.

4. The detection substrate according to claim 1, wherein the PIN photodiode comprises a P-type layer, an I-type layer and an N-type layer, the N-type layer is positioned at a side of the cathode metal away from the base substrate, the I-type layer is positioned at a side of the N-type layer away from the base substrate, the P-type layer is positioned at a side of the I-type layer away from the base substrate, and the P-type layer is electrically connected with the drain.

5. The detection substrate according to claim 1, wherein the scintillation layer is made of $Gd_2O_2S$, CsI or HgI.

6. A detector comprising the detection substrate according to claim 1.

7. The detector according to claim 6, wherein the active layer is positioned at a side of the gate away from the base substrate so that the gate shields light irradiated towards the active layer.

8. The detector according to claim 6, wherein the PIN photodiode comprises a P-type layer, an I-type layer and an N-type layer, the P-type layer is positioned at a side of the cathode metal away from the base substrate, the I-type layer is positioned at a side of the P-type layer away from the base substrate, the N-type layer is positioned at a side of the I-type layer away from the base substrate, and the N-type layer is electrically connected with the drain.

9. The detector according to claim 6, wherein the PIN photodiode comprises a P-type layer, an I-type layer and an N-type layer, the N-type layer is positioned at a side of the cathode metal away from the base substrate, the I-type layer is positioned at a side of the N-type layer away from the base substrate, the P-type layer is positioned at a side of the I-type layer away from the base substrate, and the P-type layer is electrically connected with the drain.

10. The detector according to claim 6, wherein the scintillation layer is made of $Gd_2O_2S$, CsI or HgI.

11. A manufacturing method for a detection substrate, the method comprising:
    forming a thin film transistor and a PIN photodiode above a first face of a base substrate, the thin film transistor comprising a gate, an active layer, a source and a drain; and
    forming a scintillation layer above a second face of the base substrate, the second face of the base substrate opposite the first face of the base substrate;
    the thin film transistor and PIN photodiode formed by:
    forming a cathode metal and the gate above the first face of the base substrate, the cathode metal provided at a same layer as the gate, and the cathode metal made of the same material as that of the gate;
    forming a transparent electrode above the cathode metal;
    forming the PIN photodiode above the transparent electrode;
    forming the active layer above the gate so that the gate shields light irradiated towards the active layer; and
    forming the source and the drain above the active layer and the PIN photodiode, the drain formed as an anode of the PIN photodiode.

12. The manufacturing method for a detection substrate according to claim 11, wherein forming the PIN photodiode above the cathode metal comprises:
    forming a P-type layer above the cathode metal;
    forming an I-type layer above the P-type layer; and
    forming an N-type layer above the I-type layer, wherein the N-type layer is electrically connected with the drain.

13. The manufacturing method for a detection substrate according to claim 11 wherein forming the PIN photodiode above the transparent electrode comprises:
    forming an N-type layer above the transparent electrode;
    forming an I-type layer above the N-type layer; and
    forming a P-type layer above the I-type layer, wherein the P-type layer is electrically connected with the drain.

* * * * *